United States Patent
Wojtecki et al.

(10) Patent No.: US 11,187,983 B2
(45) Date of Patent: *Nov. 30, 2021

(54) EUV PATTERNING OF MONOLAYERS FOR SELECTIVE ATOMIC LAYER DEPOSITION

(71) Applicant: International Business Machines Corporation, Armonk, NY (US)

(72) Inventors: Rudy J. Wojtecki, San Jose, CA (US); Ekmini A. De Silva, Slingerlands, NY (US); Noel Arellano, Freemont, CA (US); Noah F. Fine Nathel, Arlington, MA (US)

(73) Assignee: International Business Machines Corporation, Armonk, NY (US)

( * ) Notice: Subject to any disclaimer, the term of this patent is extended or adjusted under 35 U.S.C. 154(b) by 224 days.

This patent is subject to a terminal disclaimer.

(21) Appl. No.: 16/018,170

(22) Filed: Jun. 26, 2018

(65) Prior Publication Data
US 2019/0391494 A1    Dec. 26, 2019

(51) Int. Cl.
| | | |
|---|---|---|
| *G03F 7/16* | (2006.01) | |
| *G03F 7/09* | (2006.01) | |
| *H01L 21/027* | (2006.01) | |
| *H01L 21/311* | (2006.01) | |
| *G03F 7/075* | (2006.01) | |

(52) U.S. Cl.
CPC .............. *G03F 7/16* (2013.01); *G03F 7/0752* (2013.01); *G03F 7/092* (2013.01); *H01L 21/0276* (2013.01); *H01L 21/31144* (2013.01)

(58) Field of Classification Search
CPC . G03F 7/16; G03F 7/165; G03F 7/091; H01L 21/0276
See application file for complete search history.

(56) References Cited

U.S. PATENT DOCUMENTS

| | | | |
|---|---|---|---|
| 5,545,507 A * | 8/1996 | Simpson .............. | G03C 1/4989 430/264 |
| 8,536,068 B2 | 9/2013 | Weidman et al. | |
| 9,570,302 B1 | 2/2017 | Chang et al. | |
| 9,618,846 B2 | 4/2017 | Shamma et al. | |
| 10,782,613 B2 * | 9/2020 | Wojtecki ................. | G03F 7/165 |
| 2007/0278179 A1 * | 12/2007 | Afzali-Ardakani ..... | G03F 7/165 216/41 |
| 2009/0246527 A1 * | 10/2009 | Stellacci ................ | B82Y 30/00 428/403 |
| 2012/0088369 A1 * | 4/2012 | Weidman .............. | G03F 7/0752 438/703 |

OTHER PUBLICATIONS

Alaboson et al., "Templating Sub-10 nm Atomic Layer Deposited Oxide Nanostructures on Graphene via One-Dimensional Organic SelfAssembled Monolayers," Nano Lett., 2013, 13 (12), pp. 5763-5770.
Anonymous, "Method for fabricating conductive wires with self-assembled organic molecules as templates," IP.com disclosure, IP.com No. IPCOM000029750D; Publication Date: Jul. 9, 2004.
Anonymous, "Method for forming features on silicon wafer of extreme UV lithographic apparatus, involves performing atomic layer deposition of features, and removing self-assembled monolayer is removed from substrate for leaving feature on substrate," RD632011 A, DERWENT-ACC-NO. 2016-76757X; Copyright © 2017 Thomson Reuters; Publication Date: Dec. 10, 2016; Abstract.
Calvert, et al., "Soft x-ray (14 nm) lithography with ultrathin imaging layers and selective electroless metallization," SPIE 1993 Symposium on Microlithography, vol. 1924 (1993), pp. 30-41.
Folkers et al., "Self-Assembled Monolayers of Long-Chain Hydroxamic Acids on the Native Oxides of Metals," Langmuir, 1995, vol. 11, No. 3, pp. 813-824.
Jiang et al., "Area-Selective ALD with Soft Lithographic Methods: Using Self-Assembled Monolayers to Direct Film Deposition," J. Phys. Chem. C 2009, 113, 17613-17625.
Lipczynska-Kochany, "Photochemistry of Hydroxamic Acids and Derivatives," Chem. Rev. 1991, 91. 477-491.

* cited by examiner

*Primary Examiner* — Daborah Chacko-Davis
(74) *Attorney, Agent, or Firm* — Michael R. Robetts

(57) ABSTRACT

A patterning method is described that utilizes self-assembled monolayers (SAMs) formed with hydroxamic acid compounds and area selective atomic layer deposition (ALD). In the examples, regions of the SAM exposed to extreme ultraviolet radiation (EUV) become resistant to ALD deposition. Subsequent treatment of the exposed SAM to an ALD process results in selective growth of an ALD film on the non-exposed regions of the SAM, leaving the exposed regions substantially free of ALD material.

22 Claims, 15 Drawing Sheets

Apply SAM Precursor

Pattern-Wise Expose

ALD

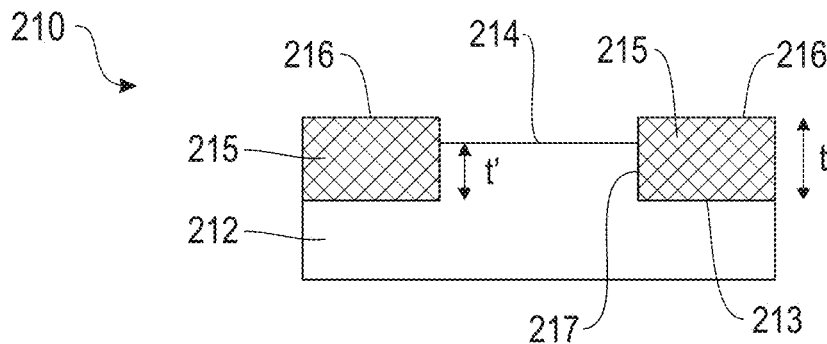
FIG. 2A
Coat SAM Precursor
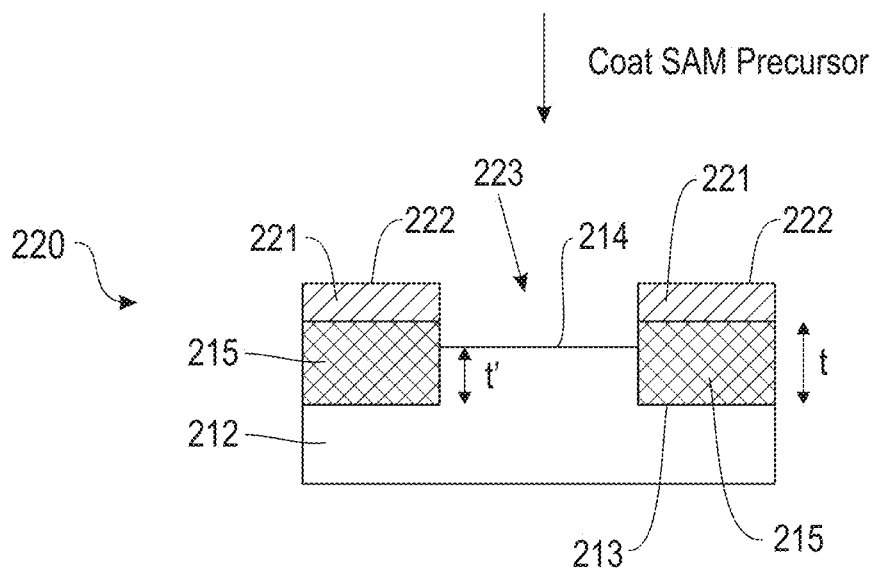
FIG. 2B
Flood Expose
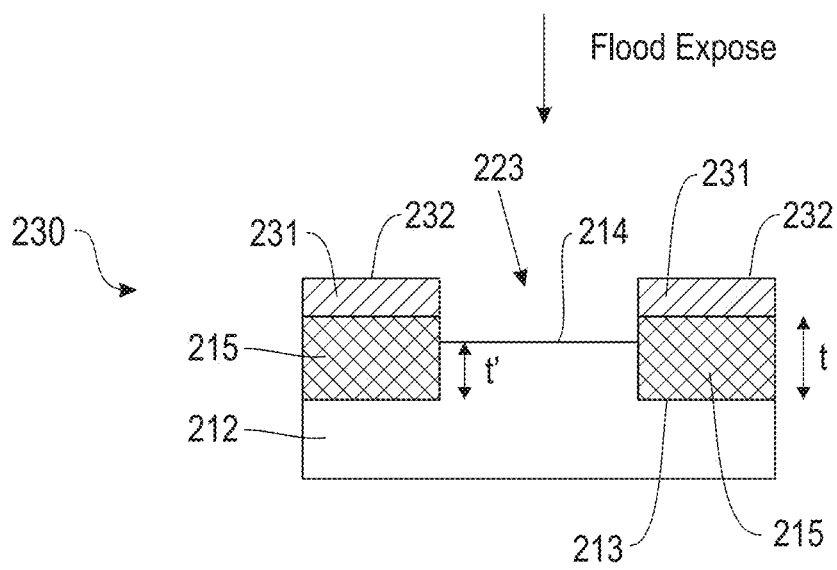
FIG. 2C

EUV PATTERNING OF MONOLAYERS FOR SELECTIVE ATOMIC LAYER DEPOSITION

BACKGROUND

The present invention relates to extreme ultraviolet (EUV) patterning of monolayers for selective atomic layer deposition and, more specifically, to patterning of monolayers that results in crosslinked head groups contacting the substrate.

The implementation of extreme ultraviolet (EUV) lithography in high volume manufacturing faces patterning challenges that exceed the limitations of traditional top-down patterning techniques. The top-down techniques function effectively in optical and deep ultraviolet (DUV) lithography where lithographic polymers such as chemically amplified resists provide sufficient patterning resolution. As these systems undergo evaluation in EUV, several limitations of the conventional systems become increasingly apparent. First, photo-generated acids, which trigger the chemical contrast for image generation, tend to diffuse beyond the exposed regions, leading to image blurring that impacts the critical dimensions of features. Second, traditional polymeric materials that have low absorbance for EUV wavelengths may require higher dose exposures that reduce throughput. Third, conventional post-exposure development steps for removing the exposed regions (for positive tone development) or non-exposed regions (for negative tone development) can lead to pattern collapse. This can be observed upon drying of the resist surfaces after a wet development step, where the recession of aqueous solution can impart significant capillary forces on the small resist features, causing damage or ultimate collapse of the features.

Atomic layer deposition (ALD) is a chemical vapor deposition technique that produces atomically smooth and conformal coatings even on high aspect ratio features. This technique can deposit a wide range of materials—metals, nonmetals and their related oxides and nitrides through either thermal processes or plasma-enhanced processes (generally used in the deposition of transition metals).

The thermal deposition process generally requires two reaction steps per atomic layer deposited (an organometallic precursor followed by an oxidizing agent). In the first half cycle of an ALD process, the film surface is saturated with an organometallic precursor that reacts with surface groups generating covalent bonds with the surface. This reaction is self-limiting in that the half cycle will only lead to the formation of one layer of the functionalized organometallic. The second half-cycle involves the introduction of an oxidizing agent that generates surface reaction groups for the next reaction cycle. This method restricts film formation to the deposition of one atomic layer at a time, where multiple cycles or exposures/pulses of the precursors are used to reach the desired film thickness.

ALD processes that are area selective (AS-ALD), where the deposited film forms only on selected surfaces, can be important in the fabrication process. In this case, self-assembled monolayers (SAMs) of organic molecules can act as effective deactivation layers that inhibit the surface reactions utilized to build film growth in ALD. Moreover, SAM-forming compounds can possess selectivity for different surfaces. For example, a SAM-forming compound possessing a bare thiol group will selectively adhere to a metal surface (e.g. Au, Cu) and not a dielectric (e.g. Si, $SiO_2$ & metal oxides). This property enables one to selectively deactivate a pre-defined surface (e.g., Cu surface patterns can be selectively inhibited while adjacent Si surfaces undergo ALD growth). By controlling the area where these metals/metal oxides are deposited, the number of lithography, processing and etching steps can be reduced making this goal highly sought by semiconductor manufacturers.

SUMMARY

Accordingly, a method is disclosed, comprising:

forming an initial self-assembled monolayer (SAM) on a top surface of a substrate using a compound comprising i) a head group comprising a hydroxamic acid or a salt thereof and ii) a tail group covalently linked to the head group, the tail group comprising a $C_{10}$-$C_{30}$ hydrocarbyl group, wherein optionally one or more hydrogens of the hydrocarbyl group are substituted with fluorine;

exposing the initial SAM pattern-wise to high energy radiation, thereby forming a modified SAM, the modified SAM comprising exposed regions and non-exposed regions; and depositing a material by atomic layer deposition (ALD) substantially or exclusively onto either the exposed regions or the non-exposed regions of the modified SAM without selectively removing beforehand any portion of the modified SAM.

Further disclosed is a method comprising:

forming a self-assembled monolayer (SAM) on a portion of a top surface of a substrate, thereby forming a treated top surface, the SAM formed using a compound comprising i) a head group comprising a hydroxamic acid and ii) a tail group covalently linked to the head group, the tail group comprising a $C_{10}$-$C_{30}$ hydrocarbyl group, wherein optionally one or more hydrogens of the hydrocarbyl group are substituted with fluorine;

flood-exposing the treated top surface to high energy radiation, thereby forming an exposed top surface comprising both regions of exposed SAM and regions containing no SAM; and depositing a material by atomic layer deposition (ALD) selectively onto either the regions of exposed SAM or the regions containing no SAM.

Also disclosed is a method, comprising:

exposing an extreme ultraviolet radiation (EUV)-sensitive monolayer to EUV, thereby forming a portion of the monolayer that either enhances or suppresses surface deactivation for atomic layer deposition; and using an atomic layer deposition (ALD) process to generate a pattern of deposited material (film) on a non-exposed portion of the monolayer, wherein prior to the ALD, no development step of the monolayer is performed.

The above-described and other features and advantages of the present invention will be appreciated and understood by those skilled in the art from the following detailed description, drawings, and appended claims.

BRIEF DESCRIPTION OF THE SEVERAL VIEWS OF THE DRAWINGS

FIGS. 2A-2E are cross-sectional layer diagrams showing a second method in which a patterned initial SAM is subjected to a flood exposure to generate a modified SAM containing exposed SAM. The ALD process selectively deposits ALD material on portions of the substrate surface that do not contain SAM.

FIGS. 7A-7B are large line areas and Berkeley logo, respectively, observed in bright field optical microscopy.

FIGS. 7C-7D are dark field images observed in optical microscopy showing large line spacing patterns.

FIG. 8A: 274 mJ dose showing a 15 nm trench. FIG. 8B: 180 mJ dose showing a 7 nm trench. FIG. 8C: 118 mJ exposure showing a 6 nm trench.

DETAILED DESCRIPTION

Disclosed are methods of forming patterned self-assembled monolayers (referred to below as "modified SAMs") that can have increased or suppressed resistance to an ALD deposition compared to an initial SAM. The modified SAMs are formed by exposing an initial SAM to radiation, preferably extreme ultraviolet (EUV) radiation. Herein, EUV radiation has a wavelength between 4 nm and 124 nm. In a preferred embodiment, the exposure wavelength is between 4 nm and 20 nm. In an embodiment, the radiation has a wavelength of 13.5 nm.

An initial SAM can be prepared by disposing a SAM-forming compound (also referred to herein as a "SAM compound") on a top surface of a substrate in an amount that saturates the available binding sites of the top surface. The initial SAM has a thickness of one monolayer of the SAM compound.

The SAM compound comprises a head group covalently bound to a tail group. The head group comprises at least one hydroxamic acid group, and is capable of binding to the top surface of the substrate. The head group can be bound to the top surface by a covalent bond, ionic bond, hydrogen bond, hydrophobic bond, or combinations thereof. The tail group comprises a monovalent aliphatic $C_{10}$-$C_{30}$ hydrocarbyl group (i.e., a group comprising carbon and hydrogen). Optionally, each hydrogen of the hydrocarbyl group can be substituted with fluorine. The initial SAM is a close-packed monolayer structure comprising molecules of a SAM compound bound by the head group to the top surface of the substrate, with the tail group extending from the head group to the atmosphere interface at the top surface of the initial SAM.

The hydroxamic acid portion of the initial SAM, which is in contact with the underlying layer, is capable of undergoing a radiation-induced change that alters the ability of the ALD process to form an ALD film disposed on the irradiated areas of the SAM. Herein, the ALD film comprises the material generated by a full ALD cycle (i.e., two half cycles).

Irradiating the initial SAM to high energy radiation forms a modified SAM having altered resistance to deposition of a material in an ALD process compared to the initial SAM. "Altered resistance" means the resistance of the exposed SAM to deposition of a material in an ALD process can be greater or less than the resistance of the initial SAM. The difference in resistance is sufficient to allow an ALD process to form a patterned ALD film on a pattern-wise exposed SAM without removing any portion of the SAM beforehand. The ALD process deposits the ALD material for a given number of ALD cycles selectively on the regions of the modified SAM having the least resistance to the ALD process, leaving the more resistant regions of the modified SAM free of, or substantially free of, the ALD material. The regions of least resistance can be the exposed or non-exposed regions of the modified SAM.

Figure 4:
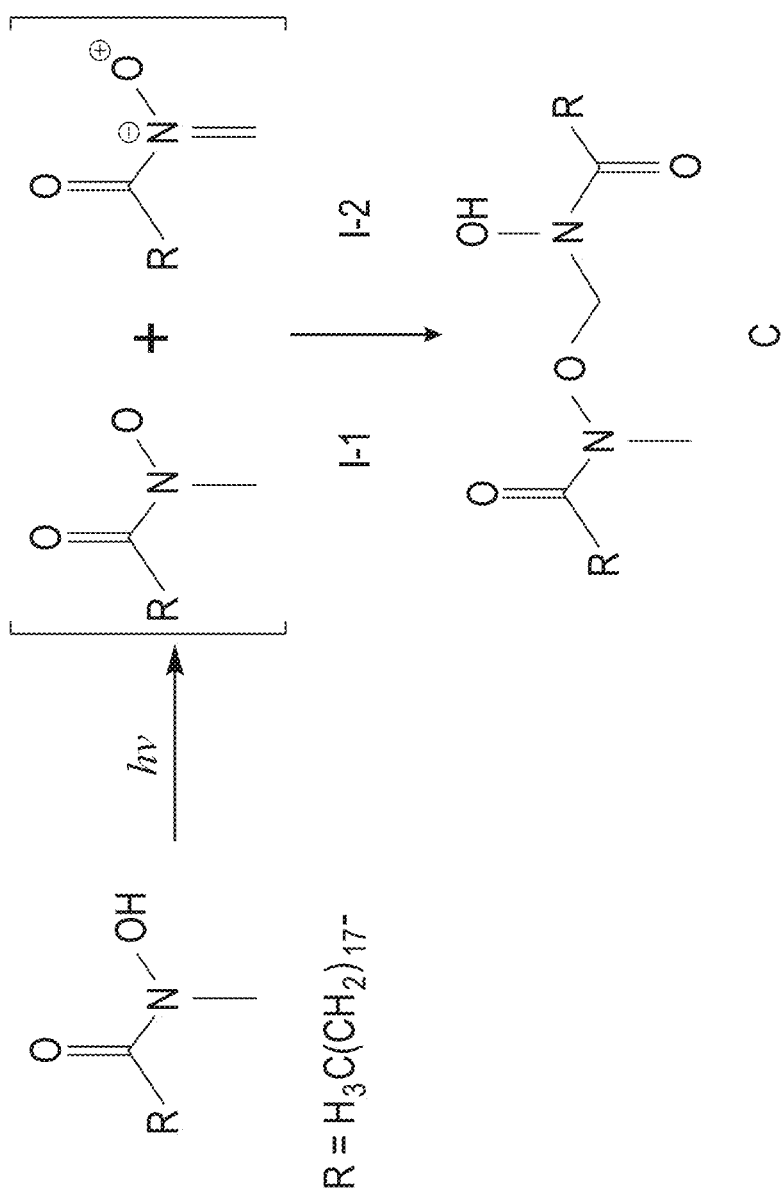
FIG. 4 is a proposed cross-linking reaction scheme for hydroxamic acid compound H-2. H-2 undergoes the formation of two different unstable photogenerated species I-1 and I-2 that can subsequently react intermolecularly to produce a coupled product having structure C or intramolecularly to also produce a stable product.

No restriction is placed on the radiation-induced change. Changes that can occur in the exposed areas of the initial SAM include: i) intermolecular bond-forming reactions between adsorbed SAM compounds as shown in FIG. 4, ii) intermolecular bond-forming reactions between adsorbed SAM compounds and surface groups of the substrate, iii) intermolecular bond-forming reactions between surface groups of the top layer of the substrate, iv) intramolecular bond-forming or bond-breaking reactions of adsorbed SAM compounds, v) intramolecular bond-forming or bond-breaking reactions of surface groups of the top layer of the substrate, vi) aggregation or de-aggregation of adsorbed SAM compounds in the exposed area, and vi) combinations of any of the foregoing. As more specific non-limiting examples, the radiation-induced change can be a polymerization or coupling of the head groups of the bound molecules of SAM compound, a radiation-induced change in aggregation of the bound molecules of the SAM compound, a radiation induced increase in ester formation between the head groups and surface groups, or combinations of the foregoing.

The initial SAM can be a non-patterned layer as exemplified in FIG. 1B, described further below in more detail. In this instance, the initial SAM is similar to a resist coated as a uniform layer on a top surface of a substrate. Pattern-wise exposure of the non-patterned initial SAM generates a modified SAM containing exposed regions and non-exposed regions. In this non-limiting example, the exposed regions of the modified SAM have increased resistance to ALD deposition compared to the non-exposed regions. As a result, the ALD process preferentially deposits ALD material on the top surface of the non-exposed regions, leaving the exposed regions having none of, or substantially none of, the ALD material disposed thereon. Unlike typical resists that require a development step after exposure, the modified SAM can be used directly to form a patterned ALD film layer (a negative-tone image) disposed substantially or solely on the non-exposed regions of the modified SAM.

The initial SAM can be patterned as exemplified in FIG. 2B, described further below in more detail. A patterned initial SAM can be formed by contacting a substrate, whose top surface contains two or more regions of different compositions, with a SAM compound that preferentially adsorbs to one or more, but not all, compositions of the top surface. As a non-limiting example, the top layer of the substrate can comprise a line pattern of a metal (e.g., Cu) spaced by regions comprising silicon and/or silicon oxide. In this example, the SAM compound does not adsorb to the silicon and/or silicon oxide surface, whereas the metal line pattern has a top surface comprising metal oxide and/or metal hydroxide surface groups that are capable of forming salts and/or esters with the head group of the SAM compound (e.g., hydroxamic acid esters). Contacting the substrate with a solution of the SAM compound produces a layered structure comprising a patterned initial SAM disposed solely on, or substantially on, the metal line pattern, leaving the silicon/silicon dioxide surface free of SAM. Flood-exposing the layered structure to EUV produces a patterned modified SAM disposed on the metal line pattern. The modified SAM has increased resistance to ALD deposition compared to the initial SAM. The subsequent ALD deposition forms a patterned ALD film layer disposed solely on, or substantially on, the silicon/silicon dioxide surface.

The exposed regions of the modified SAM can have enhanced or suppressed affinity for the ALD material compared to non-exposed regions of the modified SAM. Enhanced affinity of the exposed regions means that for a given number of ALD cycles the ALD material is more likely to nucleate in the exposed regions of the modified SAM compared to the non-exposed regions. In this instance, the exposed regions are "active" for the ALD process, and the non-exposed regions are "non-active" for the ALD process. Suppressed affinity of the exposed regions means that for a given number of ALD cycles the ALD material is more likely to nucleate on the non-exposed regions of the SAM compared to the exposed regions of the SAM. In this instance, the exposed regions are "non-active" for the ALD process, and the non-exposed regions are "active" for the ALD process.

The ALD process deposits an ALD film selectively on the active surface regions of the modified SAM and any active surface regions of the substrate lacking the SAM. The ALD process comprises at least 1 cycle, more preferably 10-10000 cycles, and even more preferably 10-1000 cycles. The disclosed methods do not require selectively removing portions of the modified SAM prior to the ALD process (i.e., no development step is performed prior to the ALD process to remove active or non-active surface regions of the modified SAM).

The maximum number of ALD cycles is the number of cycles above which an unacceptable amount of ALD material is formed on the non-active surface regions. For robustness, a higher number of ALD cycles is preferred. The non-active regions of the SAM preferably inhibit deposition of the ALD material for at least 10 cycles, more preferably at least 100 cycles, and even more preferably at least 1000 cycles. In the examples further below, the exposed regions of the SAM are non-active surfaces for the ALD deposition.

When the ALD film layer is formed on the non-exposed regions of the modified SAM, the ALD film is a negative-tone image of the exposure pattern. When the ALD film layer is formed on the exposed regions of the modified SAM, the ALD film is a positive-tone image of the exposure pattern.

After ALD film formation, the resulting layered structure can undergo a conventional selective etch process to transfer the pattern of the ALD film into one or more layers of the substrate, thereby generating a relief pattern within the substrate layers. The ALD film can be selectively removed by the etch process. Alternatively, the ALD film can serve as a mask for the etch process, allowing material not masked by the ALD film to be selectively removed.

After the selective etch, any remaining ALD film, modified SAM, and/or material of the top layer of the substrate, can then be removed by a lift-off process. These materials can be lifted off stepwise or together, leaving a patterned structure comprising a relief pattern within the substrate. The relief pattern can comprise one or more layers of the substrate.

SAM-Forming Compounds

The head group of the SAM-forming compound comprises a functionality capable of undergoing a coupling reaction or a polymerization reaction induced by the high energy exposure. As non-limiting examples, monolayers comprising head groups containing a hydroxamic acid group can undergo coupling when exposed to extreme ultraviolet wavelengths. Preferably, the hydroxamic acid group is an N-alkyl hydroxamic acid, wherein the N-alkyl group contains 1-10 carbons. FIG. 4 illustrates this coupling reaction.

More specific SAM-forming compounds have a structure according to formula (1):

$$H'{-}[{-}T'']_a \qquad (1),$$

wherein a is 1 or 2,

H' is a head group comprising a hydroxamic acid group (*—C(=O)N(R')OM') capable of binding to a top surface of a substrate by electrostatic interactions and/or a covalent bond, wherein R' is selected from the group consisting of hydrogen and $C_1$-$C_{10}$ alkyl groups, and M' is selected from the group consisting of hydrogen and positive-charged counterions, each T' is an independent tail group covalently linked to the head group, wherein each T' comprises a monovalent aliphatic $C_{10}$-$C_{30}$ hydrocarbyl group, and optionally, one to all hydrogens of the hydrocarbyl group are substituted with fluorine.

Herein, an atomic center having a bond to an asterisk means the atomic center is covalently linked to another unspecified atomic center of the chemical structure.

The SAM-forming compounds can have 1 or 2 tail groups. Preferred SAM-forming compounds have 1 tail group (i.e., a=1). The SAM-forming compounds can be used singularly or in combination.

The hydroxamic acid group of H' can be in the form of a salt (*—C(=O)N(R')O$^-$M$^+$), where M$^+$ is a positive-charged counterion such as, for example Li$^+$, Na$^+$, K$^+$, Rb$^+$, or Cs$^+$.

Non-limiting R' groups include methyl, ethyl, n-propyl, iso-propyl, n-butyl, iso-butyl, t-butyl, n-pentyl, n-hexyl, n-heptyl, n-octyl, n-nonyl, and n-decyl.

Tail groups T' are independent branched or non-branched $C_{10}$-$C_{30}$ aliphatic hydrocarbon groups, optionally substituted with one or more fluorine groups. Exemplary non-limiting acyclic aliphatic groups include those having the structure *—CH$_2$(CH$_2$)$_n$CH$_3$, where n is an integer having a value of 8 to 28 (e.g., n-decyl, n-undecyl, n-dodecyl, n-tridecyl, n-tetradecyl, n-pentadecyl, n-hexadecyl, n-heptadecyl, n-octadecyl, n-nonadecyl, and n-eicosyl).

In an embodiment, the SAM-forming compound contains no rings.

Each tail group T' can be partially fluorinated or wholly fluorinated. Herein, a perfluorinated tail group contains only the elements carbon and fluorine (e.g., perfluoro-n-decyl, perfluoro-n-undecyl, perfluoro-n-dodecyl, and the like).

Other more specific SAM-forming compounds have a structure according to formula (2):

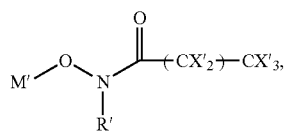

(2)

wherein
M' is selected from the group consisting of hydrogen and positive-charged counterions,
R' is a monovalent aliphatic C$_1$-C$_{10}$ alkyl group,
—(CX'$_2$)$_n$—CX'$_3$ is the tail group, wherein n is an integer having a value of 9 to 29, and each X' is an independent monovalent radical selected from the group consisting of hydrogen and fluorine.

Method 1

A first method of forming a patterned ALD film layer is illustrated in FIGS. 1A-1F. In this method, a non-patterned initial SAM is formed on a substrate top surface. Pattern-wise exposure of the initial SAM using EUV irradiation generates a patterned SAM that can be used directly in an ALD process to form a patterned ALD film disposed on the non-exposed regions of the modified SAM.

Substrate 110 (FIG. 1A) is a multi-layered substrate comprising bottom layer 112 and top layer 113 having top surface 114. Top surface 114 has contact with an atmosphere. As a non-limiting example, bottom layer 112 can be a silicon wafer and top layer 113 can be a copper film in contact with the silicon wafer. Top surface 114 can comprise oxides of copper (CuO and/or CuO$_2$) as a result of oxygen plasma cleaning.

Figure 1A:
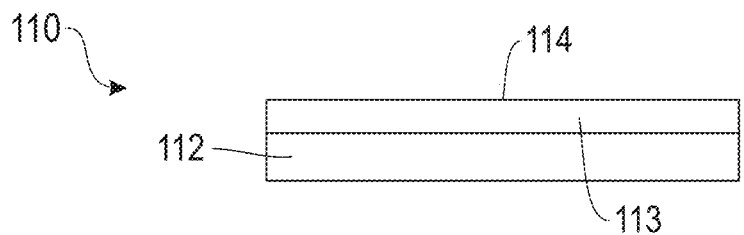
FIGS. 1A-1F are cross-sectional layer diagrams illustrating a first method in which a non-patterned initial SAM is subjected to a pattern-wise exposure to generate a modified SAM containing exposed and non-exposed regions. The ALD process selectively deposits ALD material on the non-exposed regions.
Figure 1B:
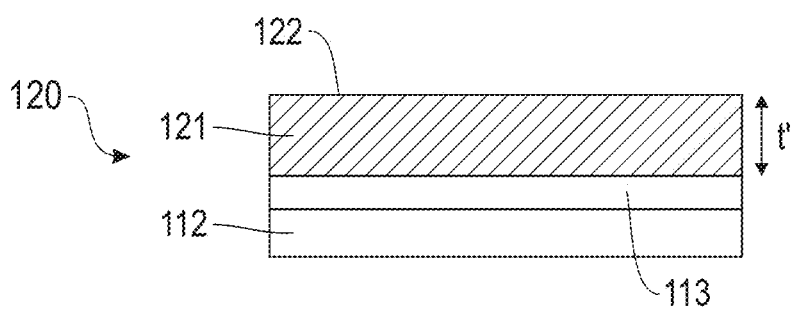

A SAM-forming compound is then applied to substrate 110, thereby forming structure 120 (FIG. 1B). Structure 120 comprises initial SAM layer 121 disposed on top layer 113. Initial SAM layer 121 has a thickness t' equal to about one monolayer of the SAM compound. Initial SAM layer 121 can be given an optional post-application bake and/or a post-application solvent rinse (not shown).

Optionally, the initial SAM layer can be treated with a second application of the SAM compound in order to minimize defects in the initial SAM layer (not shown). The initial SAM layer is not removed prior to the second application.

Figure 1C:
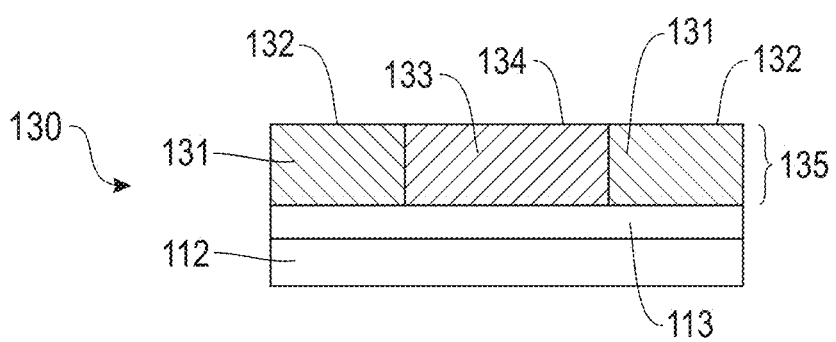

Pattern-wise exposure of structure 120 to EUV radiation produces structure 130 (FIG. 1C). Structure 130 comprises a modified SAM layer 135 comprising exposed features 131 and non-exposed features 133. Exposed features 131 have top surface 132, and non-exposed features 133 have top surface 134. In this example, exposed features 131 are non-active to a given ALD process (i.e., are resistant to ALD deposition), and non-exposed features 133 are active to a given ALD process. The modified SAM can be given an optional post-exposure bake and/or a post-exposure solvent rinse before ALD deposition (not shown).

Figure 1D:
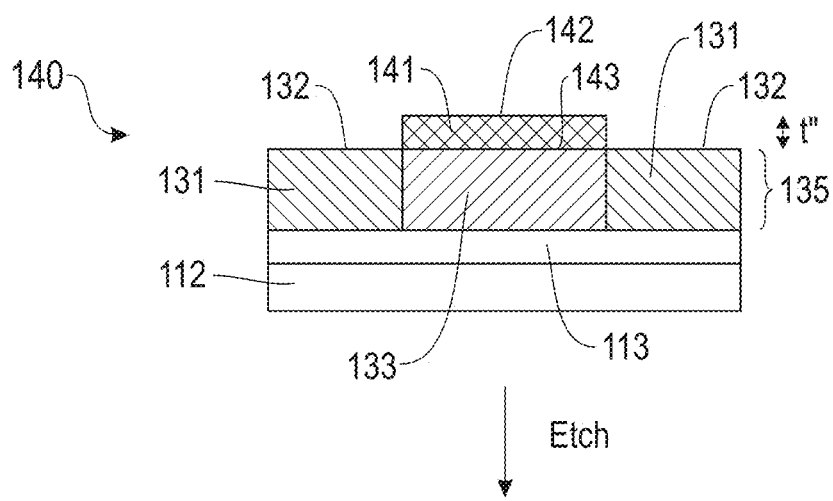

Structure 130 is subjected to an ALD process that deposits an ALD material selectively on non-exposed top surface 134, thereby forming structure 140 (FIG. 1D). Structure 140 comprises ALD features 141 comprising the ALD material. ALD features 141 have top surface 142 and thickness t">0. No restriction is placed on thickness t" with the proviso that structure 140 performs according to its intended purpose. None or substantially none of the ALD material is disposed on top surface 132 of exposed SAM features 131. The ALD process can include as many ALD cycles as necessary to generate a desired thickness t" of ALD material on the active surfaces while leaving non-active surfaces free of, or substantially free of, ALD material. Bottom surfaces 143 of ALD features 141 are in contact with non-exposed features 133.

Figure 1E:
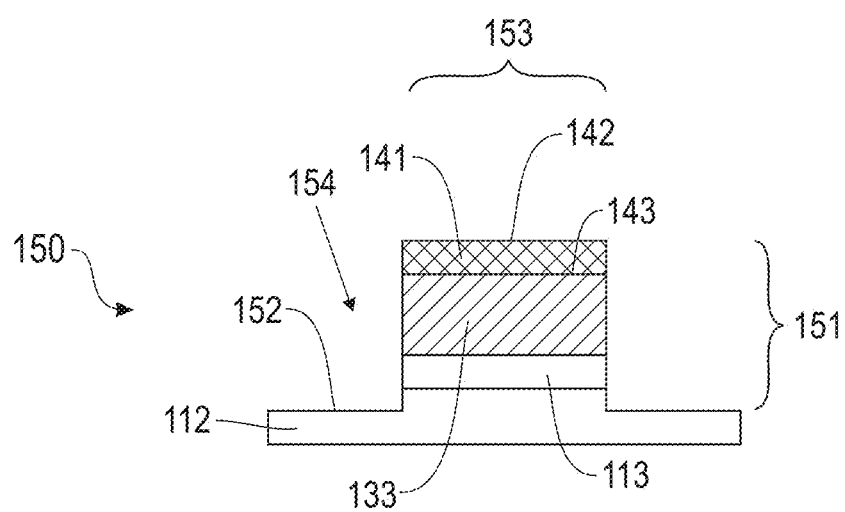

Structure 140 is then subjected to a conventional etch process. In this example, features 141 serve as an etch mask, the etch process removing exposed SAM features 131, portions of top layer 113 of substrate 110 beneath exposed SAM features 131, and a portion of bottom layer 112 of substrate 110 beneath exposed SAM features 131. The etch process produces structure 150 (FIG. 1E). Structure 150 comprises patterned layer 151 whose topographical features 153 are composed of ALD features 141, non-exposed SAM features 133, a portion of top layer 113, and a portion of bottom layer 112. Trenches 154 have bottom surface 152 comprising material of bottom layer 112.

Figure 1F:
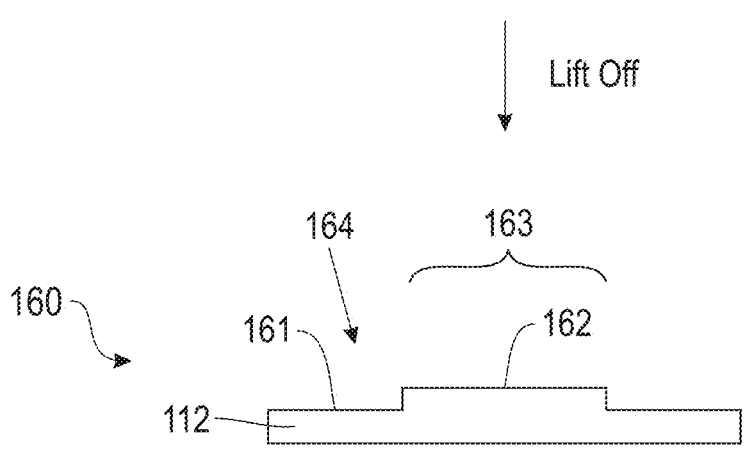

Finally, structure 150 can be subjected to a lift off process that removes ALD features 141, non-exposed SAM features 133, and underlying top layer 113, thereby forming structure 160 (FIG. 1F). Structure 160 comprises topographical features 163 comprising material of bottom layer 112 separated by trenches 164 having bottom surfaces 161. As an example, a copper metal top layer of the substrate can be dissolved with acetic acid to effect lift-off of an overlying film stack that comprise non-exposed SAM and ALD film.

Method 2

In this method, the head group of the SAM-forming compound has preferential affinity for, and selectively adsorbs to, a portion of a top surface of a substrate that comprises two or more regions of different chemical composition.

Substrate 210 (FIG. 2A) is a multi-layered substrate comprising features 215 in contact with bottom layer 212. Bottom layer 212 has top surface 214. Features 215 can be disposed on top surface 214 (not shown), or extend into bottom layer 212 (shown). Features 215 have top surface 216, bottom surface 213, and sidewall 217. In this non-limiting example, bottom surface 213 and sidewall 217 have contact with underlying layer 212. Top surface 216 and top surface 214 of layer 212 have contact with an atmosphere and are compositionally distinct. In this example, features 215 are shown partially embedded in layer 212, and height t' is less than the thickness t of features 215. Height t' can be greater than or equal to zero. Height t' can be greater than t (not shown), equal to t (not shown), or less than t (shown).

As a non-limiting example, layer 212 can be a silicon layer having a top surface 214 comprising SiO$_2$, and features 215 can be a copper line pattern whose top surfaces 216 comprise CuO and/or CuO$_2$. In this instance, a SAM-forming compound comprising a hydroxamic acid head group would preferentially bind to the CuO and/or CuO$_2$ of top surface 216 compared to the SiO$_2$ of top surface 214.

A SAM-forming compound is then applied to substrate 210, thereby forming structure 220 (FIG. 2B). Structure 220 comprises a pattern of initial SAM features 221 selectively disposed on features 215. Structure 220 also comprises trenches 223 comprising bottom surfaces 214 having none of, or substantially none of, the SAM-forming compound disposed thereon. Trenches 223 separate initial SAM features 221. Initial SAM features 221 have a thickness equal to one monolayer of the SAM-forming compound. As in the previous method, the initial SAM features can be given an optional post-application bake and/or a post-application solvent rinse (not shown). Optionally, the initial SAM layer can be treated with a second application of the SAM compound in order to minimize defects of the initial SAM layer (not shown).

Flood exposing structure 220 to EUV radiation produces structure 230 (FIG. 2C). Structure 230 comprises exposed SAM features 231 having top surfaces 232, which are separated by trenches 223 having bottom surfaces 214. Bottom surfaces 214 have none of, or substantially none of, the SAM-forming compound disposed thereon. Exposed SAM features 231 comprise exposed SAM-forming compound. Top surfaces 232 are non-polar. The exposed SAM features can be given an optional post-exposure bake and/or a post-exposure solvent rinse (not shown).

Figure 2D:
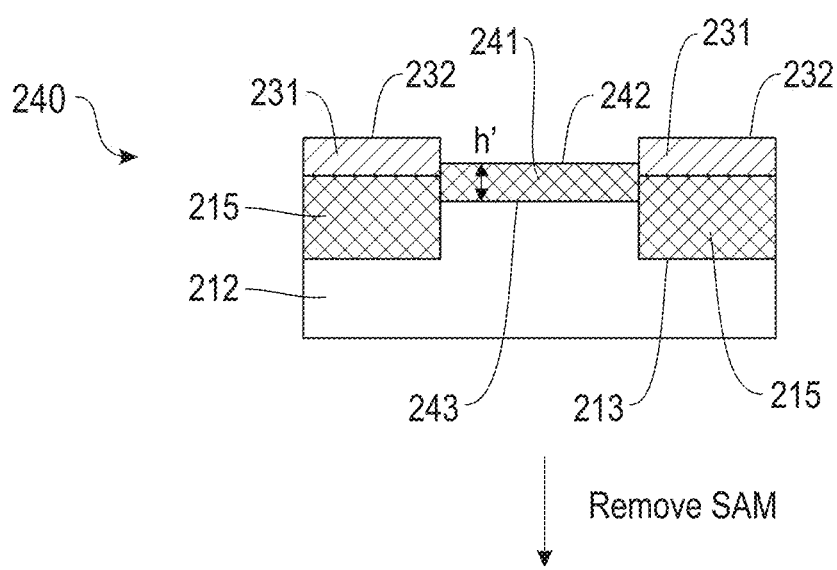

Structure 230 is then subjected to an ALD process that deposits an ALD material selectively on bottom surfaces 214 of trenches 223, forming structure 240 (FIG. 2D). None of, or substantially none of, the ALD material is disposed on top surfaces 232 of exposed SAM features 231. The ALD precursor has preferential affinity for bottom surface 214 and a low affinity, or more preferably no affinity, for top surfaces 232. The ALD process can include as many ALD cycles as necessary to generate a desired thickness h' of ALD material. ALD features 241 comprise ALD material and have top surfaces 242, which can be below (shown), above (not shown), or coplanar (not shown) with top surfaces 232. Bottom surfaces 243 of ALD features 241 are in contact with layer 212.

Figure 2E:
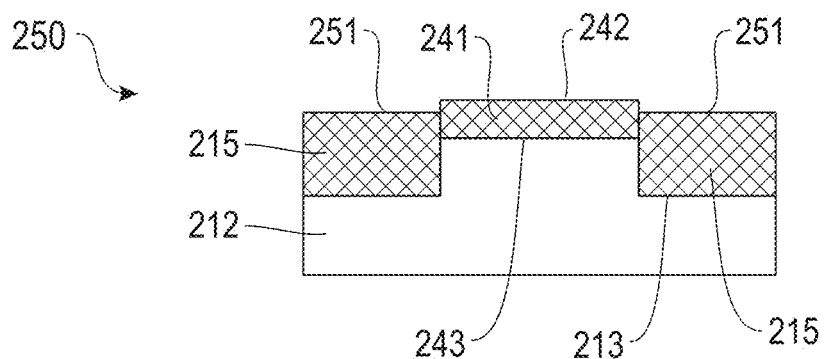

The exposed SAM features 231 can then be selectively removed, leaving structure 250 (FIG. 2E). In this example, structure 250 comprises a pattern of ALD features 241 in contact with layer 112 that are separated by features 215 of substrate 210. Features 215 have top surfaces 251, which can be below (shown), above (not shown), or coplanar (not shown) with top surface 242 of ALD features 241. Selective removal of exposed SAM features 231 can also include removing material underlying exposed SAM features 231, including material of features 215 and bottom layer 112 (not shown).

Substrates

The substrate is a layered structure comprising one or more layers and has a top surface. The substrate, and more particularly the surface of the substrate, can comprise inorganic or organic materials such as metals, carbon, and/or polymers. More particularly, the substrate can comprise a semiconducting material including, for example, Si, SiGe, SiGeC, SiC, Ge alloys, GaAs, InAs, InP, silicon nitride, titanium nitride, hafnium oxide, as well as other III-V or II-VI compound semiconductors. The substrate can comprise a dielectric material such as, for example, $SiO_2$, $TiO_2$, $Al_2O_3$, $Ta_2O_5$ and polymers (e.g., polyimides, polamides, polyethylenes). The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, non-doped or contain both doped and non-doped regions therein.

The substrate can have an anti-reflection control layer (ARC layer) or a bottom ARC layer (BARC layer) to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

Formulations for SAM Layers

Also disclosed are compositions for preparing a SAM layer. The compositions comprise a solvent and 0.1-5 wt % of a SAM-forming compound in contact with the solvent, wherein wt % is based on total weight of the composition. The SAM-forming compound can be dissolved or dispersed in the solvent. The compositions are suitable for forming a SAM layer comprising the SAM-forming compound. Exemplary solvents include, but are not limited to: toluene, xylene, dichloromethane (DCM), chloroform, carbon tetrachloride, ethyl acetate, butyl acetate, amyl acetate, propylene glycol monomethyl ether acetate (PGMEA), propylene glycol monomethyl ether (PGME), ethoxyethyl propionate, anisole, ethyl lactate, diethyl ether, dioxane, tetrahydrofuran (THF), acetonitrile, acetic acid, amyl acetate, n-butyl acetate, γ-butyrolactone (GBL), acetone, methyl isobutyl ketone, 2-heptanone, cyclohexanone, methanol, ethanol, 2-ethoxyethanol, 2-butoxyethanol, iso-propyl alcohol, n-butanol, 4-methyl-2-pentanol, N,N-dimethylformamide (DMF), N,N-dimethylacetamide, pyridine, and dimethylsulfoxide (DMSO). The solvents can be used singularly or in combination.

The solution can be applied to a top surface of a substrate using any suitable coating technique (e.g., dip-coating, spin coating) followed by removal of the solvent, thereby forming an initial SAM layer. The SAM layer has a top surface in contact with an atmosphere and a bottom surface in contact a selected surface of the substrate to which the SAM-forming compound has preferential affinity.

In general, the SAM can have a thickness of about 0.5 to about 20 nanometers, more particularly about 0.5 to about 10 nanometers, and even more particularly about 0.5 to about 2 nanometers.

Annealing Conditions

The degree of selectivity of the SAM to deactivate a given substrate surface to ALD deposition is a function of the chemical structure of the tail of the SAM-forming compound, the nature of the binding of the head group to the substrate surface (ionic or covalent), the presence of any solvent in the SAM layer, annealing conditions (e.g., temperature, environment, and annealing time) used to achieve close packing, the degree of polymerization achieved, and the SAM interface properties (e.g., SAM-air interface). These parameters can be adjusted to optimize the resistance of the SAM to deposition of a given ALD precursor.

Self-assembly of the SAM layer can occur during SAM layer formation and/or during a post-application annealing step (e.g., a subsequent thermal annealing process or solvent annealing process). Thermal annealing processes include annealing at a constant temperature and thermal gradient annealing. The thermal annealing step can be carried out at a temperature of between about 80° C. and about 350° C., more preferably between about 120° C. and about 350° C. The thermal annealing can be performed for a period between about 1 second and about 24 hours, and more particularly, between about 1 minute and about 20 minutes.

Selective Removal

The selective removal of the SAM features can be carried out by any suitable process (e.g., a thermal bake for thermally decomposable materials, a reactive ion etch process, dissolution in a selective solvent, ultraviolet exposure, or combinations of the foregoing). The selective removal can include dry-etching such as plasma etching and/or wet-etching using selective solvents and/or vapors. Typically, dry etching processes using a suitable gas (02) are employed for etching at sub-50 nm dimensions. Selectively removing SAM features creates a relief pattern that can be transferred into the underlying substrate.

Prior to the selective removal of the SAM features and/or transfer, the SAM features can be optionally chemically modified to improve properties necessary for the selective removal, such as etch resistance or mechanical properties. Etch resistant materials can be applied to a substrate surface, a surface of a SAM feature, and/or a surface of the ALD features for control of relative etch rates. The etch-resistant material can be deposited from the vapor phase by a process including, chemical vapor deposition (CVD), plasma enhanced CVD, atomic layer deposition (ALD), sequential infiltration synthesis (SIS), sequential infiltration of metal salts, sputtering, thermal evaporation, electron beam evaporation, pulsed laser deposition, or other suitable deposition method that is compatible with the processes and equipment used in microelectronics fabrication.

A chemical modification can be accomplished by a variety of known methods. For example, chemical agents can be used to bind or chemically couple to functional groups of the SAM to effect, for example, increased solubility property differences that can advantageously be used to selectively remove SAM features.

Selective removal of the SAM features can remove an underlying material of the substrate and/or resist.

Utility

The above-described methods can be used to form layered structures comprising patterned layers of metals, metal oxides, nitrides or polysilicon. The methods advantageously provide structural features having reduced feature size and good uniformity.

In the following examples, the exposed portion of the SAM acts as a mask to block deposition of an ALD material.

EXAMPLES

Figure 3A:
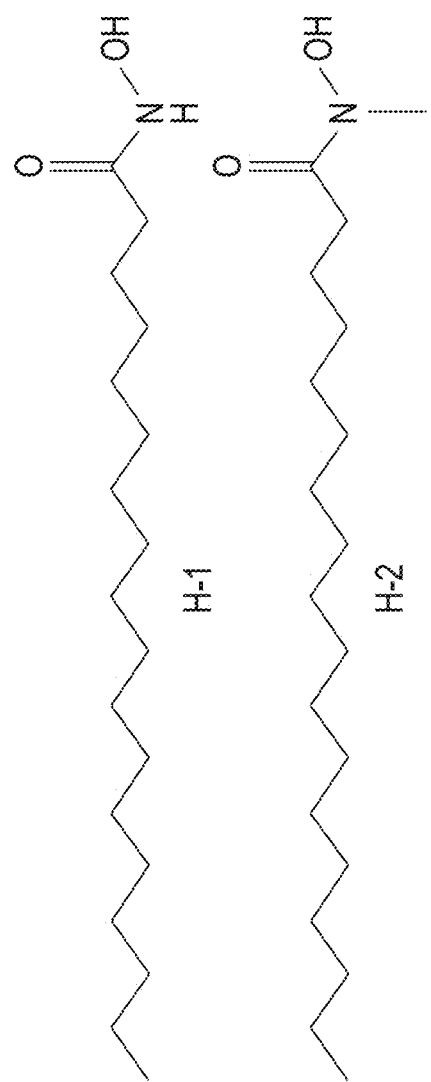
FIG. 3A shows the chemical structure of two SAM-forming compounds H-1 (octadecyl hydroxamic acid) and H-2 (octadecyl n-methyl hydroxamic acid).

Two hydroxamic acids H-1 and H-2 (N-methylated), whose structures appear in FIG. 3A, were synthesized from C18 chain fatty acid stearic acid closely following a literature preparation (FOLKERS et al., "Self-Assembled Monolayers of Long-Chain Hydroxamic Acids on the Native Oxide of Metals," *Langmuir* 1995, 11(3), 813-824). These hydroxamic acids provides a long aliphatic chain effective at blocking ALD growth.

Figure 3B:
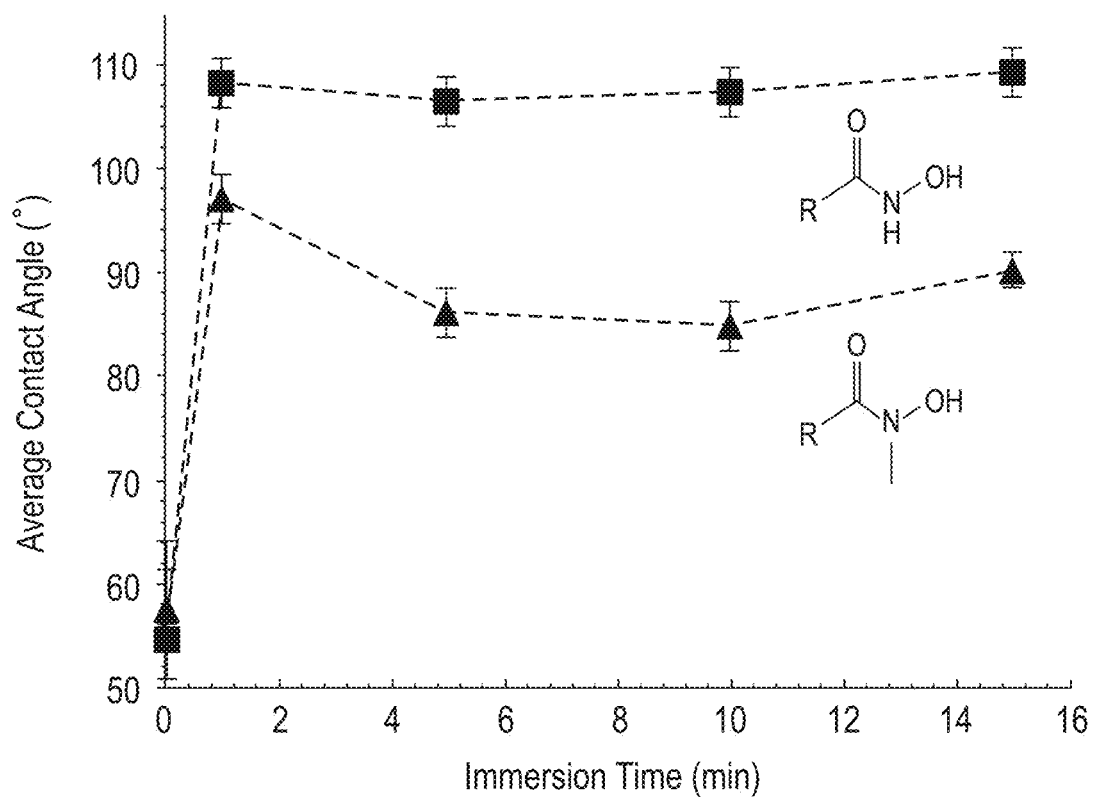
FIG. 3B is a graph showing the contact angle of a Cu surface as a function of time immersed in a solution of SAM components H-1 and H-2 of FIG. 2A.

The following procedure is representative. A hydroxamic acid (H-1) was dissolved in 4-methyl-2-pentanol as a 0.1 wt % solution, based on total weight of the solution. At this concentration, the hydroxamic acid rapidly forms an initial SAM on the surface of a freshly cleaned (using $O_2$ plasma) Cu film (50 nm thickness) on Si substrate, indicated by the high contact angle obtained within a minute of immersion in the respective solution (FIG. 3B). However, as previously observed in a number of literature reports (JIANG et al., "Area-Selective ALD with Soft Lithographic Methods: Using Self-Assembled Monolayers to Direct Film Deposition," *J. Phys. Chem. C.* 2009, 113, 17613-17625) despite the high contact angle, the initial SAM does not act as an effective blocking layer in a subsequent ALD step. Without wishing to be bound by theory, this is believed to be due to small defects in the SAM surface that include features such as pinholes that allow organometallic precursors during ALD to diffuse through the SAM layer and begin the nucleation of film growth in an undesired area of the SAM's surface.

It was discovered that the surface defects could be minimized by prolonged immersion (24-48 hours) of the substrate in the hydroxamic acid (H-1) solution. Therefore, in order to effectively achieve a uniform defect-free initial SAM film for use in a subsequent EUV exposure, the freshly cleaned Cu films were immersed in the hydroxamic acid solution for a period of 24 hours.

The EUV exposure (13.5 nm wavelength) of the SAM (on the Cu film on a 4 inch silicon wafer) was performed under vacuum at approximately $10^{-6}$ torr using an open frame dose matrix exposure.

The photochemistry of hydroxamic acids is illustrated in FIG. 4. When methyl hydroxamic acid (H-2) undergoes photoirradiation in solution using a nonpolar aprotic solvent, a single photoproduct is produced depicted as structure C in FIG. 4. Intermediates I-1 and I-2 are too unstable to be isolated and therefore undergo an intermolecular reaction to produce C. Intermediate I-1 and I-2 can also undergo intramolecular reactions producing stable rearrangements. (E. LIPCZYNSKA-KOCHANY, "Photochemistry of Hydroxamic Acids and Derivatives," *Chem. Rev.* 1991, 91, 477-491)

As shown below, at a certain threshold dosage of EUV radiation greater than 65 mJ, areas of the SAM exposed to EUV blocked deposition of ZnO at 150° C. by ALD. The contact angle of the non-exposed regions after EUV irradiation was lower compared to the exposed regions.

Figure 5:
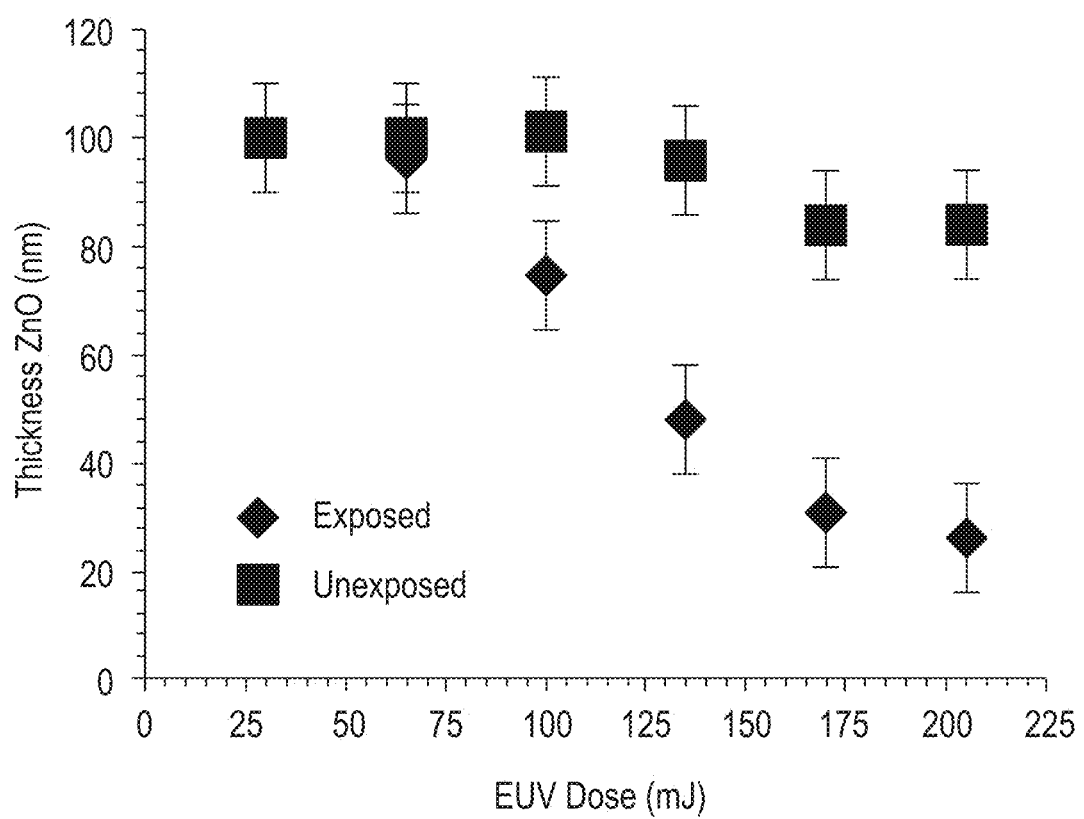
FIG. 5 is a graph showing the Rutherford backscattering thickness of an ALD film as a function of EUV exposure dose using a SAM of hydroxamic acid H-1 coated Cu film. The SAM underwent EUV dose exposure followed by ALD of ZnO at 150° C. for 1000 cycles.

Samples were subjected to an ALD process at 150° C. for up to 1000 cycles using dimethyl zinc in the first half cycle and water in the second half cycle to generate a ZnO film. Immediately after this deposition, Rutherford backscattering was used to measure the ZnO thicknesses in the exposed and non-exposed regions of the SAM. Film thicknesses in the two regions were nearly identical up to a dose of 65 mJ (FIG. 5). As the EUV dose was further increased, the thickness of ZnO in the two regions diverged. At 100 mJ the thickness of the non-exposed region was about 100±10 nm, whereas in the exposed region the thickness decreased to about 74±10 nm. At the highest dose, 205 mJ, the ZnO thickness of the exposed region was about 26±10 nm, or about 0.25 times the ZnO thickness of the non-exposed region. This result confirms the ability of photo-irradiated hydroxamic acids to inhibit the film growth of ZnO in the exposed areas relative to non-exposed areas.

Figure 6A:
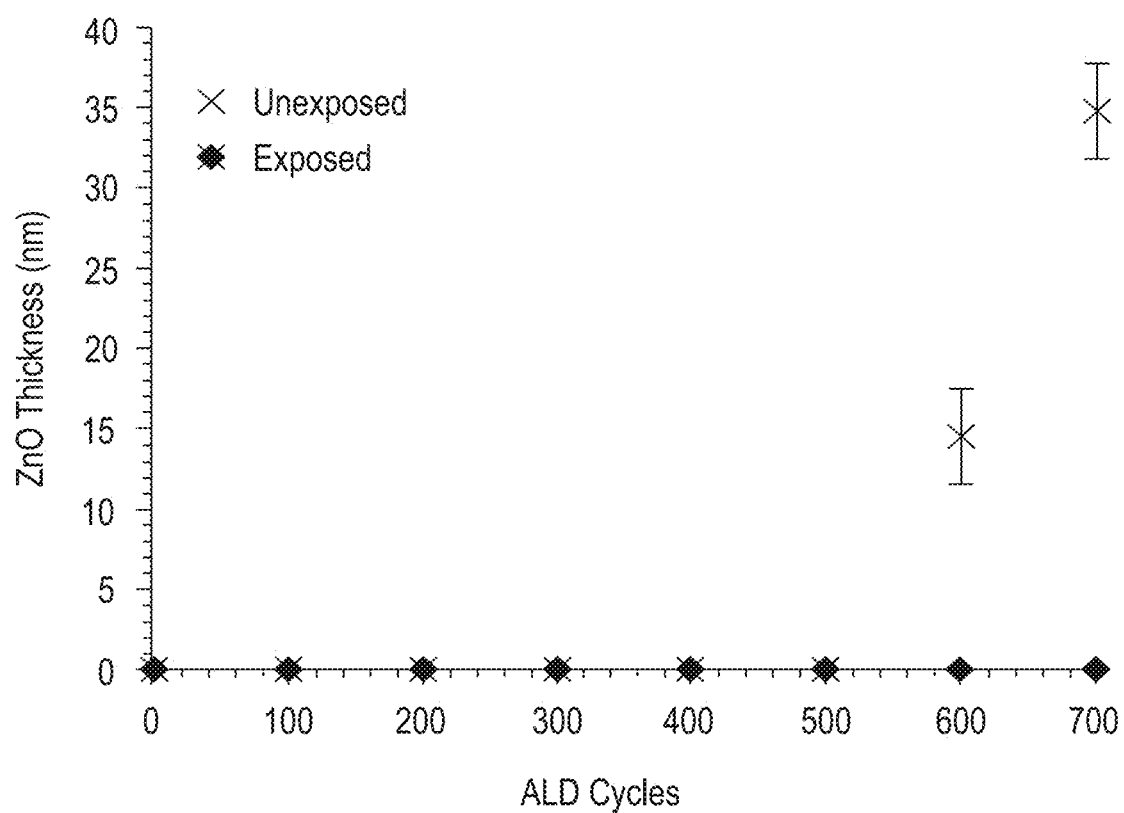
FIG. 6A is a graph showing the Rutherford backscattering data comparing the growth of ZnO on an H-1 monolayer in areas exposed to EUV at a 205 mJ dose and in areas that were non-exposed.
Figure 6B:
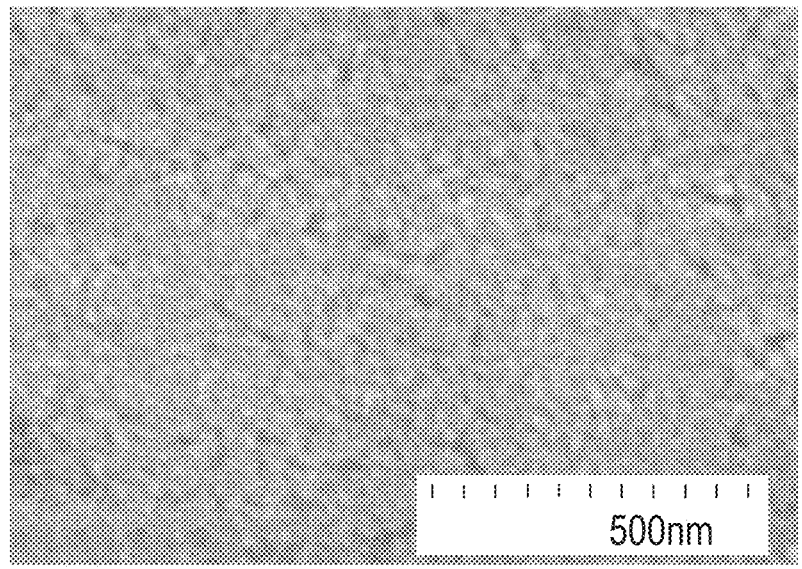
FIG. 6B is an SEM micrograph of an area of the H-1 SAM surface that was exposed to EUV at a 205 mJ dose and submitted to ALD of ZnO at 150° C. for 700 ALD cycles. A planar surface is observed consistent with a Cu thin film and no observed smaller nucleation sites of ZnO.
Figure 6C:
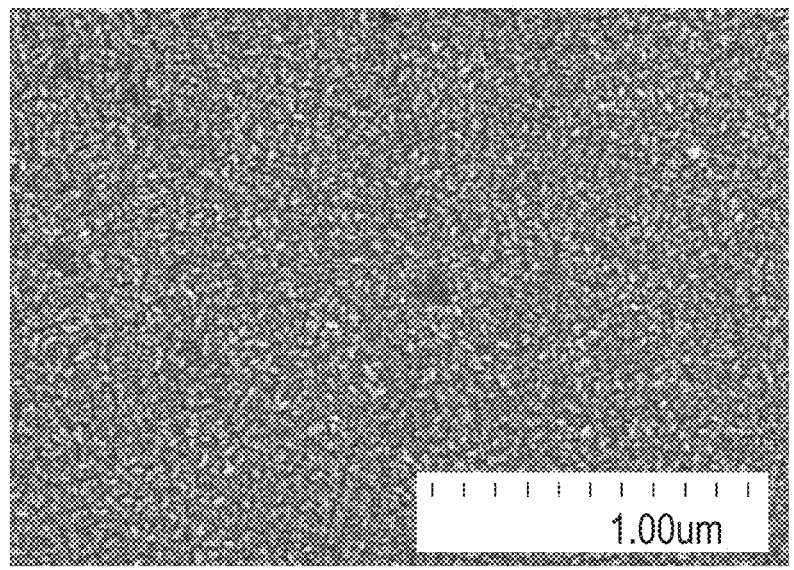
FIG. 6C is an SEM micrograph of a non-exposed area of the H-1 SAM surface after ALD of ZnO at 150° C. for 700 ALD cycles. Continuous polycrystalline ZnO film was obtained.

Using a constant EUV dosage of 205 mJ, the ZnO thickness was measured as a function of the number of ALD cycles (FIG. 6A). After 550 cycles, a ZnO film thickness of about 10 nm was observed in the non-exposed regions, with no measurable ZnO thickness observed in the exposed regions. FIG. 6B is an SEM micrograph after 700 ALD cycles of an area exposed to EUV, where a planar surface is observed consistent with a Cu thin film and no observed smaller nucleation sites of ZnO. FIG. 6C is an SEM showing continuous polycrystalline ZnO film in the non-exposed area after 700 ALD cycles.

Figure 7A:
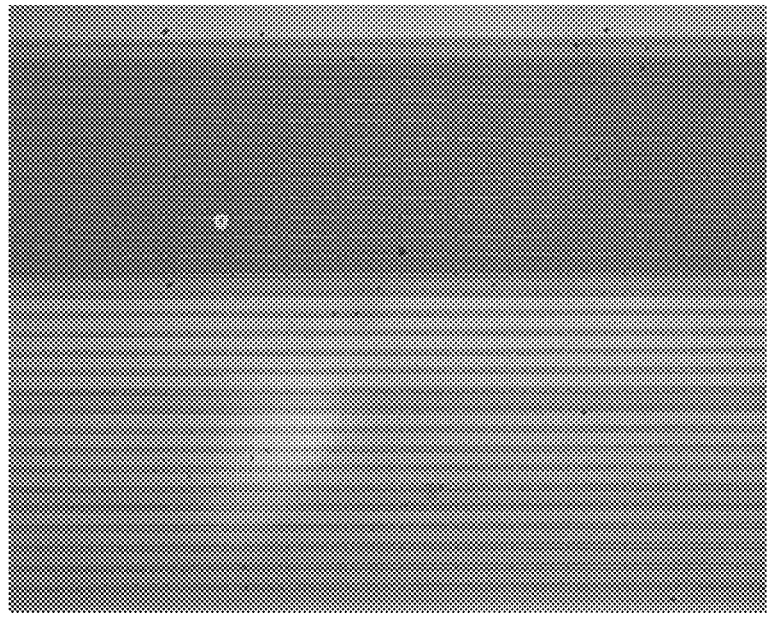
FIGS. 7A-7D are images of wafers generated from high dose EUV exposure (205 mJ) of an H-1 monolayer after 550 ALD cycles of ZnO at 150° C.
Figure 7B:
Figure 7C:
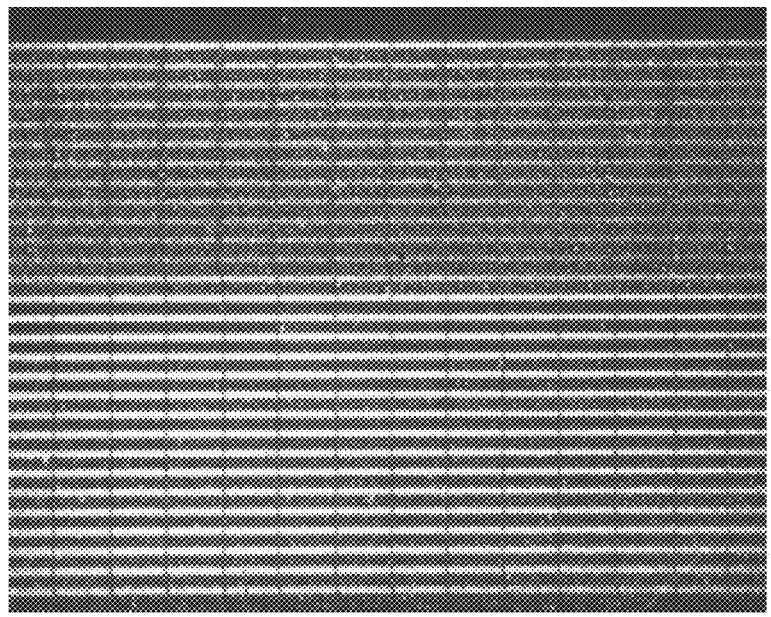
Figure 7D:
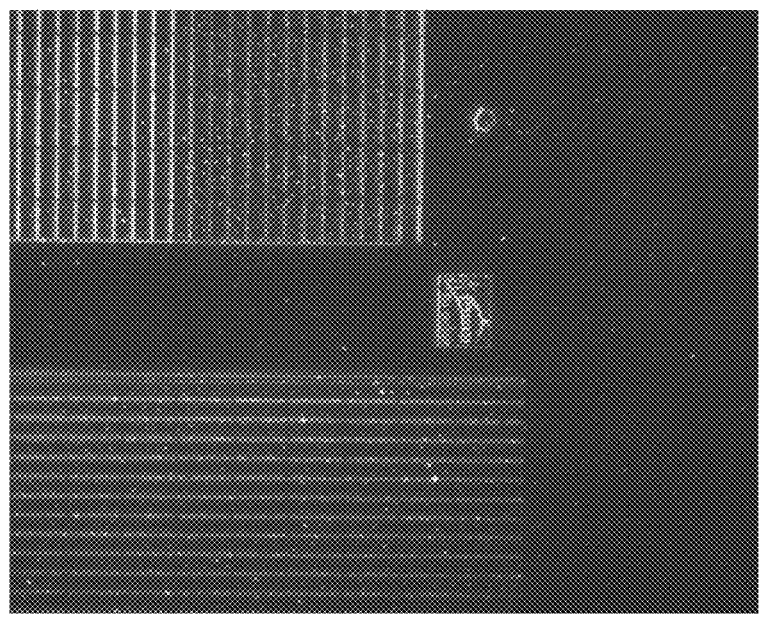

Imaged wafers were generated using a high dose exposure (205 mJ) of the SAM prepared with H-1 and 550 ALD cycles at 150° C. of ZnO. FIGS. 7A and 7B are images obtained by bright field optical microscopy showing large line areas and a Berkeley logo, respectively. FIGS. 7C and 7D are dark field images of large line spacing patterns using optical microscopy.

Figure 8A:
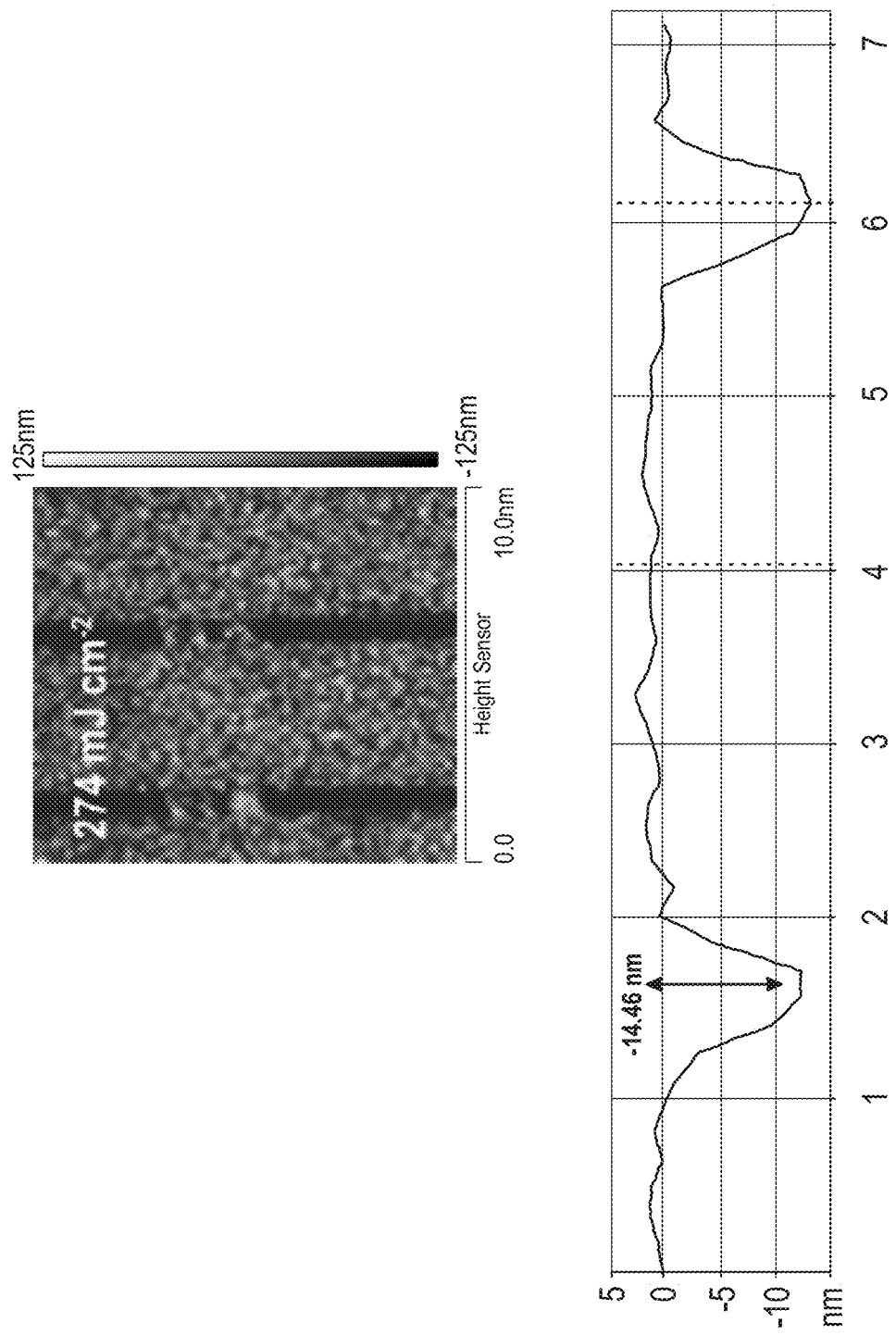
FIGS. 8A-8C are atomic force microscopy (AFM) images and accompanying 1-dimensional profiles of large line space patterns produced by ALD of ZnO at 150° C. for 700 ALD cycles of an H-1 SAM exposed and at three different EUV doses.
Figure 8B:
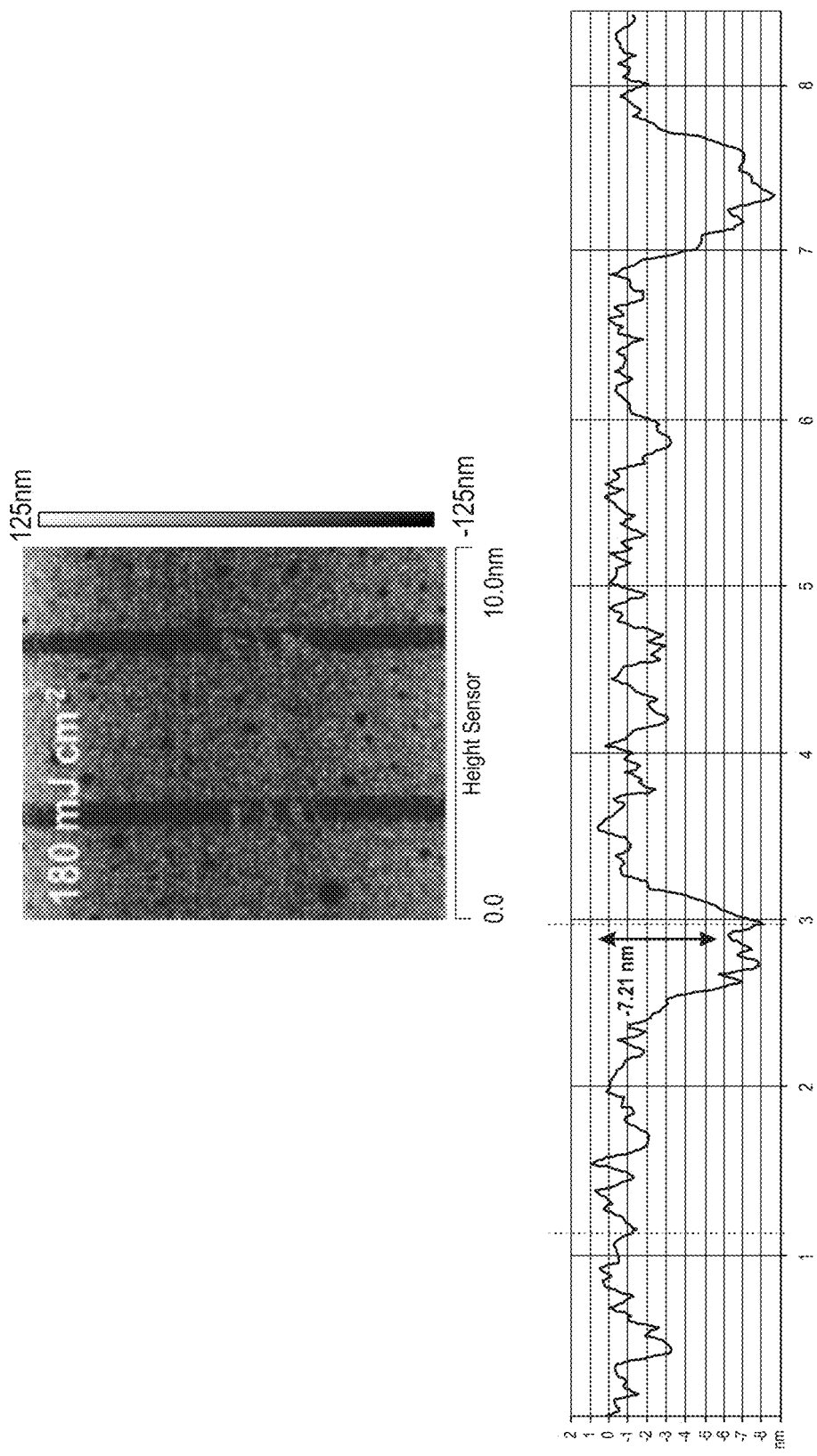
Figure 8C:
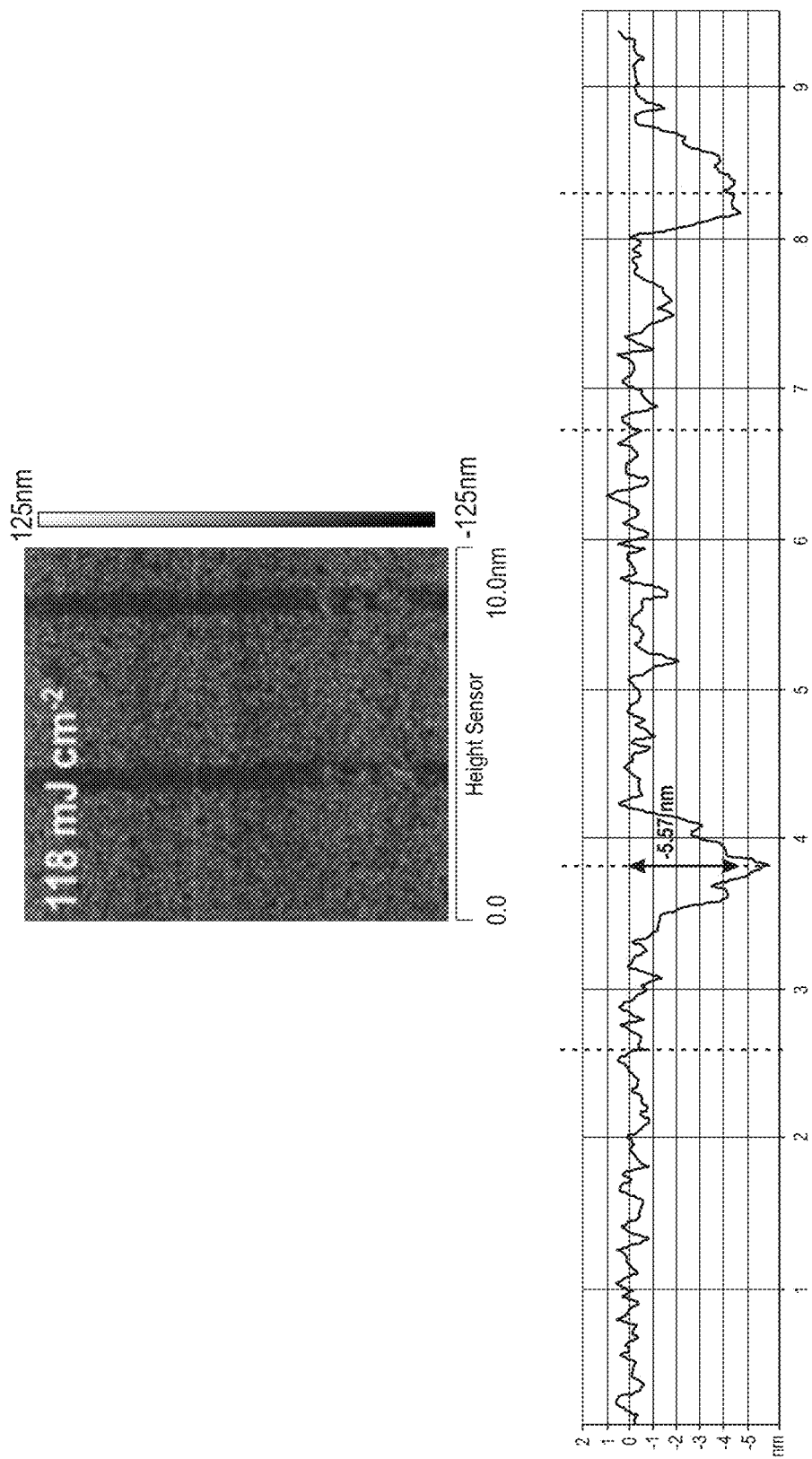

FIGS. 8A-8C are AFM profiles of large line space patterns obtained at different EUV doses and accompanying 1-dimensional (1D) profiles of the trenches formed after 550 ALD cycles at 150° C. of ZnO. The images show the expected negative tone image where areas exposed to EUV inhibited ALD growth more effectively than the non-exposed areas, giving rise to contrast. The 1D profiles show the dose dependency of the depth of the trenches where lower doses lead to shallower trenches and higher doses to deeper trenches. For a dose of 274 mJ, a 14.46 nm deep trench was obtained (FIG. 8A). For a dose of 180 mJ, a 7.2 nm deep trench was obtained (FIG. 8B). For a dose of 118 mJ, a 5.57 nm deep trench was obtained (FIG. 8C).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A method, comprising:
   forming a self-assembled monolayer (SAM) on a top surface of a substrate using a compound comprising i) a head group comprising a hydroxamic acid or a salt thereof and ii) a tail group covalently linked to the head group, the tail group comprising a $C_{10}$-$C_{30}$ hydrocarbyl group, wherein optionally one or more hydrogens of the hydrocarbyl group are substituted with fluorine;
   exposing the SAM pattern-wise to extreme ultraviolet radiation, thereby forming a modified SAM, the modified SAM comprising exposed regions and non-exposed regions, wherein said exposing removes no portion of the SAM; and
   depositing a metal oxide precursor by atomic layer deposition (ALD) substantially or exclusively onto either the exposed regions or the non-exposed regions of the modified SAM without selectively removing beforehand any portion of the modified SAM.

2. The method of claim 1, wherein the deposited metal oxide precursor is disposed on the non-exposed regions of the modified SAM.

3. The method of claim 1, wherein the deposited metal oxide precursor is disposed on the exposed regions of the modified SAM.

4. The method of claim 1, wherein the compound comprises the hydroxamic acid group.

5. The method of claim 1, wherein the compound comprises the salt of the hydroxamic acid.

6. The method of claim 1, wherein the extreme ultraviolet radiation has a wavelength between 4 nm and 124 nm.

7. The method of claim 1, wherein the compound is of formula (1):

wherein
   a is 1 or 2,
   H' is the head group comprising a hydroxamic acid group (*—C(=O)N(R')OM') capable of binding to the top surface of the substrate by electrostatic interactions and/or a covalent bond, wherein R' is selected from the group consisting of hydrogen and $C_1$-$C_{10}$ alkyl groups, and M' is selected from the group consisting of hydrogen and positive-charged counterions,
   each T' is the tail group covalently linked to the head group, wherein each T' comprises a monovalent aliphatic $C_{10}$-$C_{30}$ hydrocarbyl group, and
   optionally, one to all hydrogens of the hydrocarbyl group are substituted with fluorine.

8. The method of claim 7, wherein R' is methyl.

9. The method of claim 7, wherein R' is hydrogen.

10. The method of claim 7, wherein T' contains no rings.

11. The method of claim 1, wherein the compound is of formula (2),

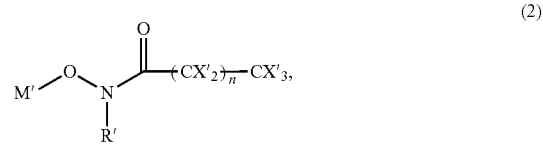

wherein
   M' is selected from the group consisting of hydrogen and positive-charged counterions,
   R' is a monovalent aliphatic $C_1$-$C_{10}$ alkyl group,
   —$(CX'_2)_n$—$CX'_3$ is the tail group, wherein n is an integer having a value of 9 to 29, and
   each X' is an independent monovalent radical selected from the group consisting of hydrogen and fluorine.

12. The method of claim 11, wherein M' is hydrogen.

13. The method of claim 11, wherein each X' is hydrogen.

14. The method of claim 11, wherein each R' is methyl.

15. The method of claim 1, wherein the metal oxide precursor is a zinc oxide precursor.

16. A method, comprising:
   forming a self-assembled monolayer (SAM) on a portion of a top surface of a substrate, thereby forming a treated top surface, the SAM formed using a compound comprising i) a head group comprising a hydroxamic acid and ii) a tail group covalently linked to the head group, the tail group comprising a $C_{10}$-$C_{30}$ hydrocarbyl group, wherein optionally one or more hydrogens of the hydrocarbyl group are substituted with fluorine;
   flood-exposing the treated top surface to extreme ultraviolet radiation, thereby forming an exposed top surface comprising regions of exposed SAM and regions containing no SAM, wherein said flood-exposing removes no portion of the SAM; and depositing a metal oxide precursor by atomic layer deposition (ALD) selectively onto either the regions of exposed SAM or the regions containing no SAM.

17. The method of claim 16, wherein the portion of the top surface of the substrate comprises copper, and the SAM is formed substantially or exclusively on the copper.

18. The method of claim 16, wherein the deposited metal oxide precursor is disposed on the regions containing no SAM.

19. A method, comprising:
exposing a portion of an extreme ultraviolet radiation (EUV)-sensitive monolayer to EUV, thereby forming an exposed portion of the monolayer that either enhances or suppresses surface deactivation for atomic layer deposition, wherein said exposing removes no portion of the monolayer; and
using an atomic layer deposition (ALD) process to generate a pattern of deposited metal oxide precursor (film) substantially or exclusively on the exposed portion or on a non-exposed portion of the monolayer, wherein prior to the ALD, no development step of the monolayer is performed.

20. The method of claim 19, wherein prior to said exposing the monolayer has a top surface containing two or more regions of different compositions.

21. The method of claim 19, wherein the exposed portion of the monolayer enhances surface deactivation, and the resulting ALD film is a negative tone image.

22. The method of claim 19, wherein the exposed portion of the monolayer suppresses surface deactivation, and the resulting ALD film is a positive tone image.

* * * * *